US009356541B2

(12) United States Patent
Begg (10) Patent No.: US 9,356,541 B2
(45) Date of Patent: May 31, 2016

(54) GRADIENT COIL ASSEMBLIES HAVING CONDUCTIVE COIL PORTIONS AND SCREENING MATERIAL

(75) Inventor: Michael Colin Begg, West Sussex (GB)

(73) Assignee: TESLA ENGINEERING LIMITED, Sussex (GB)

( * ) Notice: Subject to any disclaimer, the term of this patent is extended or adjusted under 35 U.S.C. 154(b) by 1252 days.

(21) Appl. No.: 13/156,588

(22) Filed: Jun. 9, 2011

(65) Prior Publication Data

US 2012/0068707 A1 Mar. 22, 2012

(30) Foreign Application Priority Data

Sep. 22, 2010 (GB) .................................... 1015969.7

(51) Int. Cl.
*G01R 33/385* (2006.01)
*H02P 3/06* (2006.01)

(52) U.S. Cl.
CPC ................ *H02P 3/06* (2013.01); *G01R 33/385* (2013.01); *G01R 33/3858* (2013.01)

(58) Field of Classification Search
USPC .......................... 324/300–322; 600/407–435; 382/128–131; 181/207
See application file for complete search history.

(56) References Cited

U.S. PATENT DOCUMENTS

| 5,406,204 | A * | 4/1995 | Morich et al. ................. 324/318 |
| 6,060,882 | A * | 5/2000 | Doty .............................. 324/318 |
| 6,144,204 | A | 11/2000 | Sementchenko |
| 6,437,567 | B1 * | 8/2002 | Schenck et al. ............... 324/318 |
| 6,584,337 | B2 * | 6/2003 | Dumoulin et al. ............. 600/410 |
| 6,933,722 | B2 * | 8/2005 | Tsuda et al. ................... 324/318 |
| 6,998,842 | B2 * | 2/2006 | Sinnema et al. ............... 324/318 |
| 7,030,610 | B2 * | 4/2006 | Mansfield ...................... 324/318 |
| 7,068,033 | B2 * | 6/2006 | Sellers et al. .................. 324/318 |
| 7,145,337 | B2 | 12/2006 | Goldie et al. |

(Continued)

FOREIGN PATENT DOCUMENTS

| GB | 2409522 A | 6/2005 |
| GB | 2442578 A | 9/2008 |

(Continued)

OTHER PUBLICATIONS

D.A. Seeber, et al., "Semiconductive Coated Transverse Gradient Board Increases Partial Discharge Inception Voltage", Proc. Intl. Soc. Mag., Reson. Med. 15, May 2007, p. 927.

*Primary Examiner* — Melissa Koval
*Assistant Examiner* — Tiffany Fetzner
(74) *Attorney, Agent, or Firm* — Fabian VanCott; Jeffrey K. Riddle (57) ABSTRACT

An MRIS gradient coil assembly 2A comprising a first coil layer comprising a first conductive coil portion 3X and a second coil layer comprising a second conductive coil portion 3Y. A first screening layer 6X is disposed between the first 3X and second 3Y coil layers and comprises at least one sheet of screening material. At least one insulating layer 4X comprising insulating material is provided between the first 3X conductive coil portion and the first screening layer 6X. Further the assembly comprises at least one discrete contact means 7 electrically connecting the first conductive coil portion 3X to the sheet of screening material 6X while the sheet of screening material 6X is kept from electrically contacting with the first conductive coil portion 3X, except via the at least one discrete contact means, by the at least one layer of insulating material 4X. The screening material might typically comprise a semi-conductive sheet.

18 Claims, 2 Drawing Sheets

(56) References Cited

U.S. PATENT DOCUMENTS

| | | | |
|---|---|---|---|
| 7,190,170 B1 | 3/2007 | Seeber | |
| 7,370,789 B2* | 5/2008 | Ham | 324/318 |
| 7,372,275 B2* | 5/2008 | Feenan | 324/322 |
| 7,397,244 B2* | 7/2008 | Cirel | 324/318 |
| 7,518,372 B2* | 4/2009 | Schilling et al. | 324/322 |
| 7,554,326 B2* | 6/2009 | Sakakura | 324/318 |
| 8,179,137 B2* | 5/2012 | Feng et al. | 324/322 |
| 8,575,934 B2* | 11/2013 | Iwasa et al. | 324/318 |
| 8,890,529 B2* | 11/2014 | Jiang et al. | 324/318 |
| 2003/0100825 A1* | 5/2003 | Demoulin et al. | 600/410 |
| 2003/0155174 A1* | 8/2003 | Mansfield | 181/207 |
| 2004/0251901 A1* | 12/2004 | Tsuda et al. | 324/318 |
| 2005/0040825 A1* | 2/2005 | Sellers et al. | 324/318 |
| 2006/0113996 A1* | 6/2006 | Feenan | 324/318 |
| 2007/0001676 A1* | 1/2007 | Schilling et al. | 324/322 |
| 2007/0063705 A1* | 3/2007 | Ham | 324/318 |
| 2007/0268021 A1* | 11/2007 | Sakakura | 324/318 |
| 2008/0084209 A1 | 4/2008 | Seeber et al. | |
| 2012/0068707 A1* | 3/2012 | Begg | 324/318 |
| 2012/0306495 A1* | 12/2012 | Jiang et al. | 324/318 |

FOREIGN PATENT DOCUMENTS

| | | | |
|---|---|---|---|
| GB | 2483890 A | * | 3/2012 |
| JP | 2008000324 A | | 1/2008 |
| JP | 200886766 | | 4/2008 |

* cited by examiner

GRADIENT COIL ASSEMBLIES HAVING CONDUCTIVE COIL PORTIONS AND SCREENING MATERIAL

RELATED DOCUMENTS

The present application claims the benefit under 35 U.S.C. §119(a)-(d) of United Kingdom patent application No. 1015969.7 filed Sep. 22, 2010. This application is herein incorporated by reference in its entirety.

BACKGROUND

This invention relates to gradient coil assemblies for use in magnetic resonance imaging and spectroscopy (MRIS).

Typically, an MRI machine will include at least three independent electrical windings, each one typically used to encode one Cartesian dimension (X, Y and Z). Thus, typically there will be X, Y and Z coils in a gradient coil assembly of an MRI machine.

The windings may carry up to several hundred amperes and are typically energised and de-energised over periods as short as 100 microseconds. Large voltages (typically up to 2 kV) must be applied to the windings to achieve such switching. The voltages are applied over a few microseconds. Separate windings are energised and de-energised independently, but on occasions more than one winding may be energised or de-energised simultaneously. Such instances increase yet further the potential differences present in the coil structure.

Gradient coil assemblies are typically impregnated with epoxy resins after assembly to ensure good electrical and mechanical integrity. It is a known property of such resin systems that above a certain potential difference threshold, a phenomenon known as "partial discharge" occurs in regions of high electrical stress. This phenomenon is the result of microscopic charge redistribution around the inner surfaces of voids in the dielectric. Such discharges create broadband electrical interference that is deleterious to the sensitive radio frequency detection systems used in MRIS.

It is generally agreed that partial discharge inception voltage (PDIV) occurs at lower voltage levels if there are either bubbles of air in the insulation system or there are any sharp points present on the metal coil portions making up the windings in the gradient coil assembly.

The X, Y and Z coils that make up a typical gradient coil may be manufactured from plates of copper or another suitable metal having cut patterns to form current paths, or they may be wound either from solid or hollow metal conductors. Once the paths are formed, the resulting coil is mechanically consolidated so that it can be handled without the metal turns unraveling or changing shape in an uncontrolled way. The coils are often consolidated and held in place by some kind of non-conducting backing/substrate.

In one method, a coil has its patterns formed and then to consolidate the coil turns, a composite backing is bonded to the coil using epoxy or some other resin and a hot press. Once consolidated, the coil may be formed into a non-planar shape as required without the current paths moving in an undesirable way. Once the gradient coils have been formed, they are assembled into a gradient coil assembly. The whole assembly is usually vacuum impregnated with an epoxy or some other resin and then cured for a period of time to consolidate the entire assembly.

Epoxy resins, glass cloths, and other insulating materials generally have high dielectric strengths and relatively high relative dielectric constants between about 2 and 6. In the absence of defects, they can withstand the voltage levels typically employed in MRIS. However, if there are voids in the insulation, the large difference in relative dielectric constants between the material and the void causes enhancement of electric field in the void, and PDIV may occur at relatively low voltage levels (eg 1 kV).

Two major causes of low PDIV are air bubbles and sharp points or burrs on the metal coils.

Where there are air bubbles, the electric field in the air bubble may be much higher than in the material surrounding the air bubble. Electrical discharge occurs in air at a field strength of about 3 kV/mm. This type of field strength can occur in an air bubble in the gradient coil assembly in an MRIS machine.

Sharp points also lower PDIV which, generally speaking, is due to the field being concentrated at the sharp point. If a burr is present in the region of an air bubble in the insulating material in a gradient coil then the field enhancement created by the burr is liable to cause partial discharge.

As mentioned earlier, to build gradient coil assemblies it is usual to consolidate individual coils/windings and to build those coils into a complete coil assembly. Thus it is likely that the coils will be backed by partially cured epoxy resin impregnated materials (known as B-stage materials). B-stage materials have air pockets in them that cannot, in practical terms, be completely eliminated.

Further, the windings in the coils will have sharp points on them. It is not reasonable to expect to machine and consolidate coils and have no bubbles or burrs left at the end of the process.

However, in a region where B-stage material is absent it can be reasonable to expect that a vacuum impregnation process can yield a void free region.

Thus, it has been realised that if it is possible to construct a gradient coil assembly where B-stage materials and burrs are restricted to regions of low electric field strength, it should be possible to construct gradient coil assemblies having higher PDIV.

BRIEF DESCRIPTION OF THE DRAWINGS

Embodiments of the present invention will now be described, by way of example only, with reference to the accompanying drawings in which.

DETAILED DESCRIPTION

According to a first aspect of the present invention there is provided an MRIS gradient coil assembly comprising:

a first coil layer comprising a first conductive coil portion, a second coil layer comprising a second conductive coil portion, a first screening layer, disposed between the first and second coil layers and comprising at least one sheet of screening material, and at least one insulating layer comprising insulating material provided between the first conductive coil portion and the first screening layer, wherein the assembly comprises at least one discrete contact means electrically connecting the first conductive coil portion to the sheet of screening material and the sheet of screening material is kept from electrically contacting with the first conductive coil portion, except via the at least one discrete contact means, by the at least one layer of insulating material.

The provision of a screening layer between two coil layers which is connected to one of the coil layers and hence can have a potential which follows that of one of the coil layers can help to minimise partial discharge in the region between the screening layer and the respective coil portion, by reducing the electric field in that region.

Generally speaking the screening layer will be less conductive than a simple conductor, for example less conductive than the coil portions, but more conductive than the insulating layer for it to perform its screening function whilst not preventing the gradient coil to perform its overall function. The screening layer should be transparent to magnetic fields at frequencies typical of gradient current waveforms. It is useful, in dealing with sheet-like, and essentially 2D conductors, to employ the concept of 2D resistivity, or resistance per square. This is the resistance between opposite edges of a square sheet of material (of any size). For a homogeneous, isotropic material, it is equal to the ratio of bulk resistivity to thickness. A suitable minimum resistance per square for the sheet of screening material will depend on the size of the gradient coil and the frequencies present in the gradient wave form.

It can be expressed that the resistivity of the sheet of screening material is higher than the resistivity of the coil portions and lower than the resistivity of the insulating layer.

It will be appreciated that here "resistivity of the sheet" refers to the resistivity of the sheet as a whole rather than referring to the resistivity of any one or more material that makes up the sheet. The sheet might have high conductivity (low resistivity) material in it but still have a relatively lower overall conductivity (higher overall resistivity). A specific example would be a mesh of high conductivity metal.

Alternatively it can be expressed that the resistance per square of the sheet of screening material is greater than the mean resistance per square of the coil layers and lower than the resistance per square of the insulating layer. Here the mean resistance per square of the coil layer is representative of the respective coil portion smeared-out across the whole layer. Note that in the present case it is the 2D, or layer properties of the layers that are important rather than the bulk 3D properties of the materials of the layers that would be found in a data book.

Alternatively it can be expressed that the resistance per square of the sheet of screening material is greater than what would be the resistance per square of a solid sheet made of the material of the conductive coil portions and lower than the resistance per square of the insulating layer.

The at least one sheet of screening material may be a semi-conductive sheet of material.

Note that in this specification the expression "semi-conductive" is used to refer to sheet material having a conductivity between that of a conductor and that of an insulator. Note that the term does not imply or suggest use of a conventional crystalline silicon or germanium based "semi-conductor" material or similar—it refers only to the conductive properties of the sheet material. The expression "semi-conductive" is widely used in the above sense in the high voltage insulation community.

A conventional crystalline semi-conductor material will generally be "semi-conductive", but so are/can be sheets of many other materials. In the present invention a conventional crystalline semi-conductor based material is unlikely to be the best choice because of its mechanical properties.

The sheet of screening material may comprise a graphite impregnated sheet material.

The sheet of screening material may comprise a mesh of conductive material. The conductive material might, for example, be copper, phosphor bronze, or stainless steel. In such a case, the gauge of the wire in the mesh and the size of the apertures in the mesh can be chosen to give a suitable level of conductivity for the mesh as a whole, ie to give a semi-conductive sheet material.

The sheet of screening material is preferably chosen so that it can reach a uniform potential in a period that is small compared with the time period of changes to typical gradient coil drive voltages. The sheet of screening material is preferably chosen so that it can reach a uniform potential in a period that is smaller than the inverse of the maximum frequency present in the voltage waveform applied to the gradient in use.

The sheet of screening material is preferably chosen so that the induction of eddy currents of harmful duration in MRIS is inhibited.

The sheet of screening material may have a resistance per square in the range of 10 milliohms per square to 10 kilo-ohms per square.

The sheet of screening material preferably has a resistance per square in the range of 30 milliohms per square to 10 kilo-ohms per square. This range of values is particularly suitable for gradient coil assemblies used in whole body MRIS.

The coil assembly may comprise at least one further layer of insulating material between the first screening layer and the second conductive coil portion.

An additional screening layer may be provided in association with the second coil layer. This feature is more specifically defined below.

The assembly may comprise a second screening layer disposed between the first screening layer and the second coil layer, the second screening layer comprising at least one sheet of screening material which is electrically connected to the second conductive coil portion via at least one respective discrete contact means and which is kept from electrically contacting with the second conductive coil portion, except via the at least one respective discrete contact means, by at least one respective layer of insulating material.

At least one further insulating layer may be provided between the first and second screening layers. Where the two screening layers would otherwise be in contact with one another an insulating layer will, in all or nearly all cases, be provided between those two layers.

The assembly may comprise a third coil layer comprising a third conductive coil portion, the third coil layer being disposed such that the second coil layer is disposed between the first and the third coil layers.

A respective screening layer or layers may be provided between the second and third coil layers. This feature is more specifically defined below.

The assembly may comprise a third screening layer disposed between the third coil layer and the second coil layer, the third screening layer comprising at least one sheet of screening material which is electrically connected to the third conductive coil portion via at least one respective discrete contact means and which is kept from electrically contacting with the third conductive coil portion, except via the at least one respective discrete contact means, by at least one respective layer of insulating material.

The assembly may comprise a fourth screening layer disposed between the third screening layer and the second coil layer, the fourth screening layer comprising at least one sheet of screening material which is electrically connected to the second conductive coil portion via at least one respective discrete contact means and which is kept from electrically contacting with the second conductive coil portion, except via the at least one respective discrete contact means, by at least one respective layer of insulating material.

At least one further insulating layer may be provided between the third and fourth screening layers.

The coil assembly may be arranged so that there is a single discrete electrical connection between the or each coil portion and the respective sheet of screening material. The coil assembly may be arranged so that there is a maximum of three discrete electrical connections between the or each coil portion and the respective sheet of screening material. Minimising the number of connections helps to prevent the screening layer acting as a resistive shunt in parallel with the respective coil.

The or each at least one discrete contact means may comprise a break in a respective insulating layer between the screening layer and the coil layer. The respective insulating layer may comprise a layer of glass tape with a break at one point to allow discrete contact. The or each at least one discrete contact means may comprise a conducting element that is connected to both the coil portion and the sheet of screening material. The conducting element may be connected to the coil portion at the location of the break in the respective insulating layer.

At least some of the insulating layers may comprise B-stage material. Preferably B-stage material is confined to layers between a screening layer and the coil layer to which the screening layer is connected.

The gradient coil assembly may comprise an X-coil, a Y-coil and a Z-coil. The X-coil may comprise one of the first, second and third coil portions. The Y-coil may comprise one of the first, second and third coil portions. The Z-coil may comprise one of the first, second and third coil portions.

Preferably the X-coil comprises one of first, second and third coil portions, the Y-coil comprises another of first, second and third coil portions, and the Z-coil comprises yet another of first, second and third coil portions.

The gradient coil assembly may comprise drive windings (or inner windings) and shield windings (or outer windings). There may be X-coil drive and shield windings, Y-coil drive and shield windings, and Z-coil drive and shield windings. The windings within a pair of drive and shield windings (eg one pair=the x-coil drive and shield windings) may or may not be connected to one another.

The above configurations may be used in drive windings and/or shield windings in a coil assembly—that is to say a drive winding may comprise one of the coil portions, and/or a shield winding may comprise one of the coil portions.

Thus in one embodiment with X, Y, and Z drive and shield windings there are six coil portions with associated screening and insulating layers between the adjacent coil portions in the drive windings and between the adjacent coil portions in the shield windings. In other similar embodiments associated screening arid insulating layers are provided only for the drive windings. In such a case the gradient coil assembly may be arranged to minimise the absolute voltages generated in the shield windings, for example using the techniques described in U.S. Pat. No. 7,145,337.

According to another aspect of the present invention there is provided a method of making a gradient coil assembly as defined above.

According to a further aspect of the present invention there is provided an MRI machine comprising a gradient coil assembly as defined above.

Figure 1:
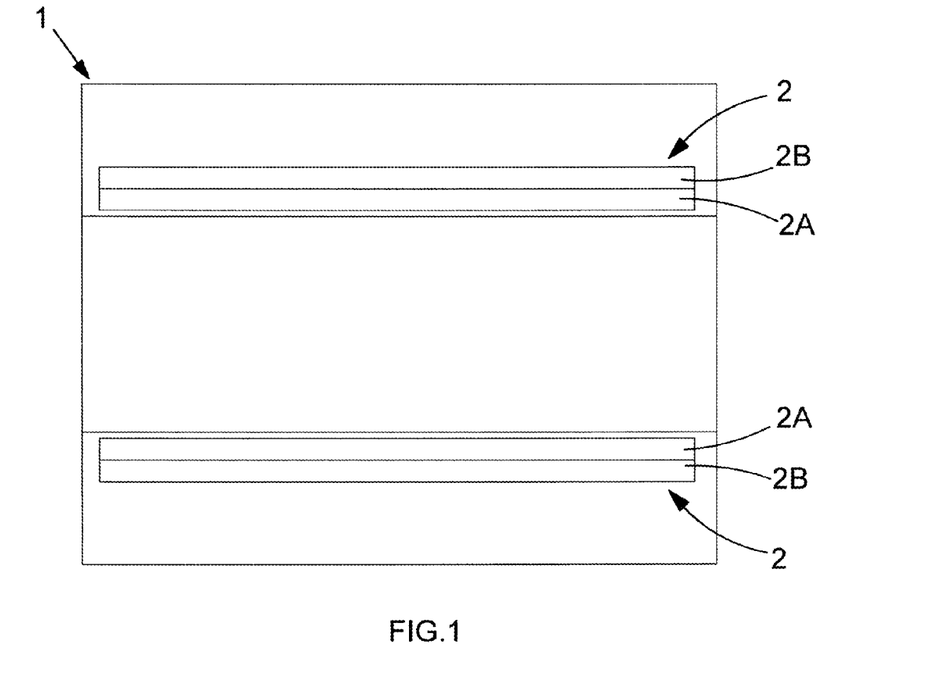
FIG. 1 schematically shows an MRI machine.

FIG. 1 shows an MRI machine of a generally conventional kind in highly schematic form and with many details omitted for the sake of clarity. The MRI machine 1 shown in FIG. 1 comprises a gradient coil assembly 2 which in the present example comprises an inner set of drive coils 2A and an outer set of shield coils 2B.

The inner set of drive coils 2A comprises windings making up an X coil, a Y coil and a Z coil, and similarly the outer shield coils 2B comprises windings making up an X shield coil, a Y shield coil and a Z shield coil.

Figure 2:
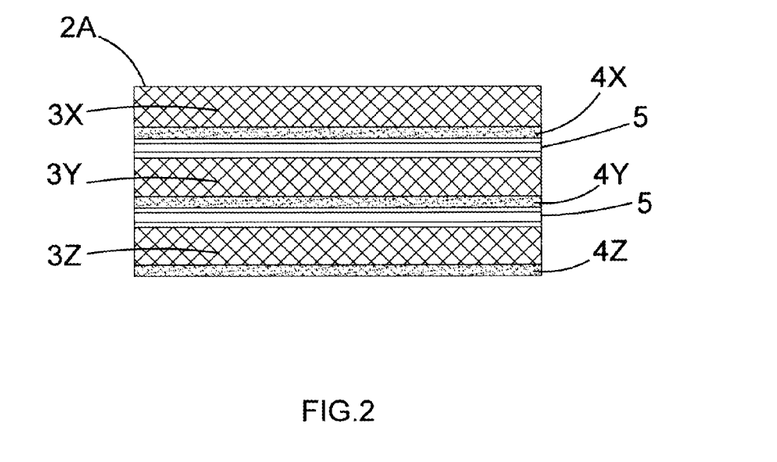
FIG. 2 schematically shows part of a conventional gradient coil assembly for use in an MRI machine of the type shown in FIG. 1.

FIG. 2 schematically shows part of a conventional gradient drive coil assembly 2A which may be used as the drive coil assembly of an MRI machine of the type shown in FIG. 1 and which may be supplemented with a similar gradient shield coil assembly 2B to make up the whole gradient coil assembly 2 in the arrangement shown in FIG. 1. However, only the drive coil portion 2A of the gradient coil assembly 2 is shown in FIG. 2.

The conventional gradient drive coil assembly 2A, a part of which is shown in FIG. 2, comprises three windings or coil portions 3X, 3Y, 3Z, which act as an X drive coil, a Y drive coil and a Z drive coil when used in the MRI machine 1. These coil portions, 3X, 3Y, 3Z are provided in different layers and other layers are provided between the conductive material of the coil portions themselves, 3X, 3Y, 3Z. In particular, each coil portion 3X, 3Y, 3Z has its own associated B-stage layer 4X, 4Y, 4Z, which is present as a result of the fabrication method used to make up the respective winding/coil portion 3X, 3Y, 3Z. Furthermore, additional insulation layers 5 are provided between the coil portions 3X, 3Y, 3Z. Specifically these are provided between the Z coil winding 3Z and the B-stage material layer 4Y associated with the Y coil winding 3Y and between the Y coil winding 3Y and the B-stage material layer 4X associated with the X coil winding 3X.

The conventional gradient drive coil assembly 2A of which part is shown in FIG. 2 is built up in the following steps with assembly taking place from the bottom upwards:

1. Form the coil turns (3X, 3Y, 3Z) by machining a plate of metal or winding metal into a desired shape.

2. Provide the bottom surface of the coil portion (3X, 3Y, 3Z) with a sheet of B-stage material. This material will help to consolidate the coil mechanically. Typically the coil portion (3X, 3Y, 3Z) and its B-stage backing (4X, 4Y, 4Z) is placed in a heated press to cure the resin B-stage material.

3. Form the consolidated coil by whatever means chosen to the desired shape.

4. Mount the coil in the gradient coil assembly.

5. Add one or more layers of insulation to maintain an adequate spacing between the layers.

6. Repeat the steps 1 to 5 as often as is necessary to complete the assembly but omitting step 5 for the final coil layer (3X).

Note of course that more layers might be introduced. For example, if a gradient coil assembly including both drive coils and shield coils were to be made then the shield coil layers could be added using a similar technique.

Furthermore, note that in some instances the B-stage material layers 4X, 4Y, 4Z might be replaced by other types of insulating material. For example the coil portions 3X, 3Y, 3Z might be wrapped in an insulating material. As is well understood, as well as providing insulation, B-stage material is useful in consolidating coils. In some cases such consolidation is not required, in other instances a different consolidation layer may be used. Further, sometimes some of the windings in the coil may be consolidated using B-stage material whilst other windings are not.

With a structure of the type described above then the problems discussed in the introduction to description will tend to arise. That is to say, partial discharge is likely to occur in use due to the presence of air bubbles in the B-stage material layers 4X, 4Y, 4Z and/or the presence of burrs, ie sharp edges or points, on the coil portions 3X, 3Y, 3Z.

Thus an alternative structure for a gradient coil assembly 2 is proposed.

Figure 3:
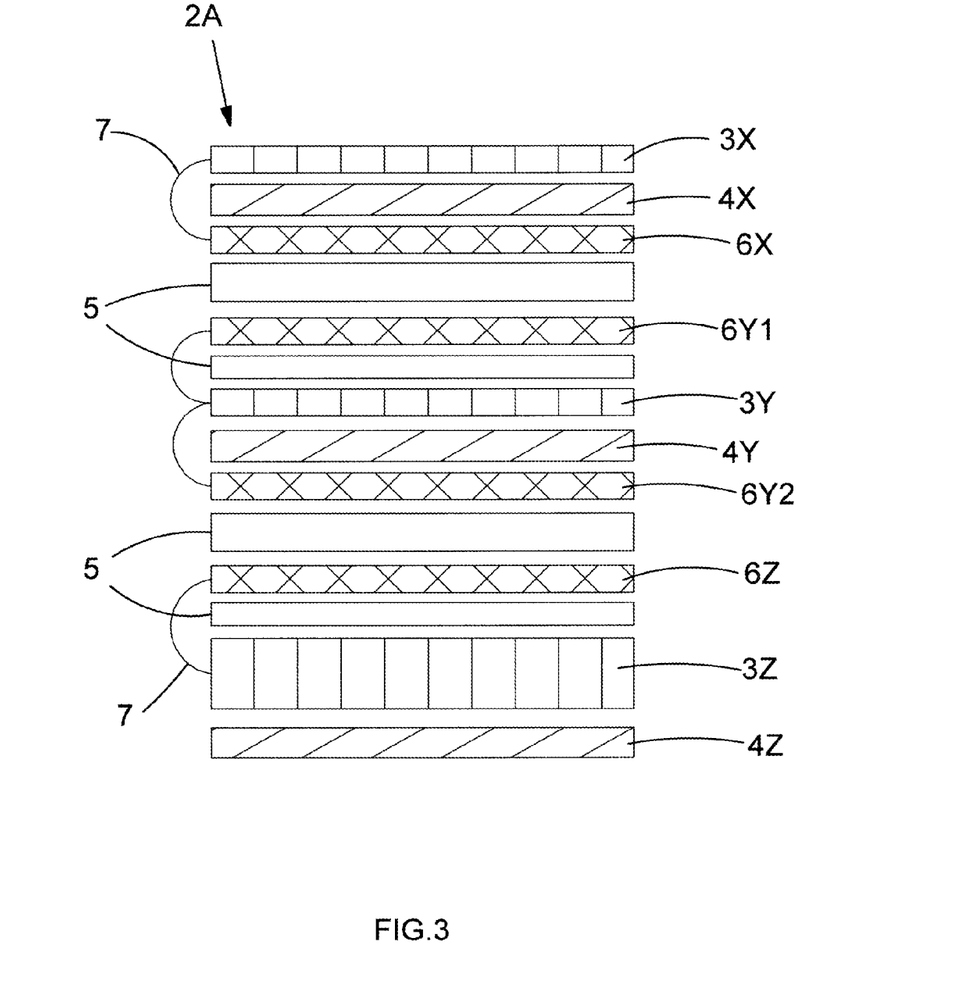
FIG. 3 schematically shows part of a gradient coil assembly embodying the present invention which is also suitable for use in an MRI machine of the type shown in FIG. 1.

FIG. 3 shows a gradient drive coil assembly 2A which again can be used in an MRI machine 1 of the conventional kind. Again, whilst FIG. 3 shows a gradient drive coil assembly 2A, the structure and techniques described below can equally be used in a gradient shield coil assembly 2B or a gradient coil assembly 2 comprising both drive and shield coils.

In the newly proposed gradient drive coil assembly 2A shown in FIG. 3, there are again three coil portions or windings 3X, 3Y and 3Z corresponding to X, Y and Z drive coils. Further, each of these X, Y and Z drive coils 3X, 3Y and 3Z is provided on a consolidating insulating composite layer, ie layer of B-stage material, 4X, 4Y, 4Z, and furthermore insulating layers 5 are provided at various locations.

However, also provided in the gradient coil assembly are respective screening layers 6X, 6Y1, 6Y2, 6Z. Each screening layer comprises a sheet of screening material and is connected via a respective connector 7 (shown in schematic form in the drawings) to one of the coil portions 3X, 3Y, 3Z. Thus a first screening layer 6X is connected via its connector 7 to the X coil winding 3X. A second screening layer 6Y1 is connected via a respective connector 7 to the Y coil winding 3Y. A third screening layer 6Z is connected via a respective connector 7 to the Z coil winding 3Z, and a fourth screening layer 6Y2 is connected via a respective connector 7 to the Y coil winding 3Y.

The steps of making up a gradient coil assembly 2A of the type currently proposed are similar to the steps described above for building up a conventional gradient coil assembly and might be as follows:

1. Form the coil turns (3X, 3Y, 3Z) by machining a plate of metal or winding metal into a desired shape.
2. Provide the bottom surface of the coil portion (3X, 3Y, 3Z) with a sheet of B-stage material. This material will help to consolidate the coil mechanically. Typically the coil portion (3X, 3Y, 3Z) and its B-stage backing (4X, 4Y, 4Z) is placed in a heated press to cure the heated resin B-stage material.
3. Form the consolidated coil by whatever means chosen to the desired shape.
4. Mount the coil portion (3X, 3Y, 3Z) in the gradient coil assembly and add a thin layer of (for example) glass tape.
5. Break the tape at one point to expose the underlying coil portion (3X, 3Y, 3Z).
6. Lay a single sheet of screening material (6X, 6Y1, 6Y2, 6Z) over the tape and connect it to the respective coil (3X, 3Y, 3Z) at the single exposed point.
7. Add a layer of insulation to maintain adequate spacing between the layers.
8. Lay another sheet of screening material on the insulation positioned to lie underneath the next coil to be laid up. Add a thin layer of (for example) glass tape.
9. Break the tape at one point to expose the underlying screening layer (6X, 6Y1, 6Y2, 6Z).
10. Take another coil constructed and formed as in steps 1 to 3. Mount it in the gradient coil assembly and connect it to the underlying screening layer (6X, 6Y1, 6Y2, 6Z) at the single exposed point.
11. Add a thin insulating layer of (for example) glass tape.
12. Repeat steps 5 to 11 as often as is necessary to complete the coil. Step 11 may be omitted after the final layer.

Again, it should be pointed out that in an alternative one or more of the coil turns (3X, 3Y, 3Z) could be insulated simply by wrapping the coil conductor paths in an insulating material, omitting the use of B-stage material.

In the coil assembly structured as described above and as shown in FIG. 3, the layers of screening material 6X, 6Y1, 6Y2, 6Z are provided both between the adjacent coil portions 3X, 3Y, 3Z and also so as to sandwich B-stage material layers 4X, 4Y and insulation layers 5 as appropriate, between the respective screening layer 6X, 6Y1, 6Y2, 6Z and the respective coil portion 3X, 3Y, 3Z. This can help to minimise partial discharge in the B-stage material and/or in other insulating layers provided in the coil assembly.

The applicants do not believe that it is practical to remove all burrs from the coils or to have consolidating layers of composite material (glass or polyester B-stage) that will be bubble free. The intention with the present techniques is to mitigate the effect that bubbles and burrs have on the electric field between gradient coil layers by screening them with one or more sheet of screening material.

Each sheet of screening material 6X, 6Y1, 6Y2, 6Z is connected to a respective one of the coil portions 3X, 3Y, 3Z as mentioned above by a respective connector 7. Moreover however, there is preferably a single connection between the screening material and its respective coil portion. In some implementations it may be necessary or appropriate to include more than a single point of contact but if this is the case then the number of points of contact will be kept small and will be chosen to be at positions where the potential in the coil portion at the respective points will be close to one another. A situation where the screening layer 6X, 6Y1, 6Y2, 6Z acts as a resistive shunt in parallel with the coil portion 3X, 3Y, 3Z is to be avoided. However, a desirable aim is to allow the screening layer to form an equipotential surface at the same potential as the respective coil portion at the point of contact between the connector and the coil portion.

The idea is that the bubbles and burrs in the zones between the coils in the gradient coil assembly, or at least the majority of them, are confined to the region between the coil portions and the respective screening layers. With the above arrangement the potential difference across such regions is, generally speaking, at most the voltage difference between a particular part of the coil portion 3X, 3Y, 3Z, and the point of contact between that coil portion 3X, 3Y, 3Z and its respective screening layer 6X, 6Y1, 6Y2, 6Z.

In the present embodiment each screening layer comprises a portion of screening material which can be considered to be semi-conductive in the sense explained in the introduction to this application—specifically in this embodiment a single semi-conductive sheet of material. What is of interest is a sheet material having the appropriate conductive properties as well as the required mechanical properties to allow it to be formed as part of the gradient coil assembly.

On the one hand, the screening layer needs to be able to act as an equipotential surface and thus be able to change its potential over its whole extent within a time period which is small compared with the time period of changes to the gradient coil drive voltages, but at the same time it must not support eddy currents of a duration which would be harmful to the MRIS processes which the MRI machine will be used to conduct.

To date, the applicants have found that semi-conductive sheet materials which are commercially available in the high voltage insulation field such as polyester glass fabric impregnated with graphite (for example Contafel® 2716) are suitable materials.

Note that other suitable screening materials may be made up of meshes or other structures where the substance of the mesh may itself be a conductor but the overall conductive property of the sheet material is what can be described as semi-conductive.

Sheet material having a resistance per square in the range of 1000-4000 Ohms per square have been used in implementations of the above described embodiment by the applicants. Generally speaking for gradient coil assemblies for use in whole body MRIS, sheet material having a resistance per square of 1000-10,000 Ohms per square is currently expected to be used by the Applicant. However, as noted above it is also currently thought that optimum performance may in fact be achieved with sheet material having lower resistance per square—specifically in the ranges given in the introduction to the description.

Of course for a particular MRI machine or type of MRI machine the preferred conductivity of the screening layer could be determined empirically.

Note that the screening layers/sheets of screening material 6X, 6Y1, 6Y2, 6Z are separated from the respective coil portions 3X, 3Y, 3Z by insulating layers (B-stage material or otherwise) and a single point of contact or a very small number of points of contact are provided between the screening layers and the coil portions. It is considered that if this is not done and a conductive or semi-conductive material is placed in intimate contact with the coil portions, there is likely to be a resulting flow of undesirable parasitic currents in the gradient coil assembly which is likely to have a deleterious effect on the gradient field quality. Thus, for example, it is considered undesirable to provide a semi-conductor layer directly on the conductive coil portions or to load the insulation material with conductive powder/granules—these lead to continuous or intimate contact between the coil portion and the conductive/semi-conductive layer and this is different from the present techniques where a discrete connection or a small number of discrete connections are provided. Continuous or intimate contact between the coil portion and the conductive/semi-conductive layer as in the undesirable arrangements mentioned above, provides an alternative low-inductance current path, by-passing the coil, and compromising magnetic performance and magnetic shielding. This cannot happen if the coil and shield are only connected at a few discrete points, all at similar electrical potential.

The presently described structure and method for making gradient coil assemblies allows good performance to be obtained in the coil assembly without trying to completely eradicate the existence of burrs on coil portions or bubbles in insulation materials which processes are prohibitively expensive and/or in practical terms impossible.

Note that the insulation layers 5 which are provided between the first and second screening layers 6X and 6Y1, and between the third and fourth screening layers 6Z and 6Y2 may be introduced using a high quality vacuum impregnation process without the use of any B-stage material (since these layers are not used for providing structural integrity to the coil portions during assembly) and thus it can be hoped that these regions will be free of air bubbles, and moreover these regions are remote from any windings so the problems of burrs should not occur in these regions.

For completeness it is mentioned that the presence or absence of hatching and similar shading included in various parts of FIGS. 2 and 3 is intended only to help illustrate the layers which have a common make up rather than to distinguish between portions which are in section and not in section.

Note that in this specification B-stage material is used to refer to the material both before and after curing—ie material that was introduced as B-stage and subsequently cured is still referred to as B-stage material.

It will be appreciated that the particular order in which the X, Y and Z coils are provided in the embodiments described above is not critical. The X, Y and Z coils may be provided in any convenient order in the assembly when using the current techniques.

The invention claimed is:

1. An MRIS (magnetic resonance imaging and spectroscopy) gradient coil assembly comprising:
a first coil layer comprising a first conductive coil portion of a first gradient coil;
a second coil layer comprising a second conductive coil portion of a second gradient coil;
a first screening layer, disposed between the first and second coil layers, the first screening layer comprising at least one first sheet of screening material;
a first insulating layer comprising insulating material provided between the first conductive coil portion and the first screening layer; and
a second insulating layer comprising insulating material provided between the second conductive coil portion and the first screening layer, wherein
the MRIS gradient coil assembly further comprises:
at least one first discrete connector electrically connecting the first conductive coil portion to the first screening layer and the first screening layer is kept from electrically contacting with the first conductive coil portion, except via the at least one first discrete connector, by the first insulating layer and is kept from electrically contacting with the second conductive coil by the insulation comprising said second insulating layer and the only gradient coil to which the first discrete connector is electrically connected is the first gradient coil.

2. An MRIS gradient coil assembly as claimed in claim 1 in which the at least one first sheet of screening material is a semi-conductive sheet of material.

3. An MRIS gradient coil assembly as claimed in claim 1 in which the at least one first sheet of screening material comprises one of a graphite impregnated sheet material and a mesh of conductive material.

4. An MRIS gradient coil assembly as claimed in claim 1 in which the at least one first sheet of screening material is chosen so that it reaches a uniform potential in period that is small compared with the time period of changes occurring in typical gradient coil drive voltages and so that the induction of eddy currents of harmful duration in MRIS is inhibited.

5. An MRIS gradient coil assembly as claimed in claim 1 in which the at least one first sheet of screening material has a resistance per square in the range of 10 milliohms per square to 10 kilo-ohms per square and is more preferably in the range of 30 milliohms per square to 1 kilo-ohms per square.

6. An MRIS gradient coil assembly as claimed in claim 1 comprising:
a third coil layer comprising:
a third conductive coil portion, the third coil layer being disposed such that the second coil layer is disposed between the first and the third coil layers; and
a third insulating layer comprising insulating material provided between the second conductive coil portion and the third conductive coil portion.

7. An MRIS gradient coil assembly as claimed in claim 6 in which a second screening layer comprising at least one second sheet of screening material is provided between the second and the third coil layers with the third insulating layer disposed between the second screening layer and the second coil layer; and
- at least one second discrete connector electrically connecting the second conductive coil portion to the second screening layer; and
- a fourth insulating layer of insulating material, between the second screening layer and the third coil layer.

8. An MRIS gradient coil assembly as claimed in claim 1 comprising:
- a second screening layer disposed between the first screening layer and the second coil layer, the second screening layer comprising:
  - at least one second sheet of screening material
  - the second screening layer being electrically connected to the second conductive coil portion via at least one second discrete connector; and
  - the second screening layer being kept from electrically contacting with the second conductive coil, except via the at least one second discrete connector, by a third insulating layer of insulating material, and
- a fourth insulating layer of insulating material, is provided between the first screening layer and the second screening layer.

9. An MRIS gradient coil assembly as claimed in claim 8, comprising:
- a third coil layer comprising a third conductive coil, the third coil layer being disposed such that the second coil layer, is disposed between the first and the third coil layers; and
- further comprising a third screening layer disposed between the third coil layer and the second coil layer, the third screening layer comprising:
  - at least one third sheet of screening material
  - the third screening layer being electrically connected to the third conductive coil portion via at least one third discrete connector; and the third screening layer being kept from electrically contacting with the third conductive coil portion, except via the at least one third discrete connector, by a fifth insulating layer of insulating material;
  - the MRIS gradient coil assembly also comprising a sixth insulating layer of insulating material disposed between the third screening layer and the second coil layer.

10. An MRIS gradient coil assembly as claimed in claim 9 comprising:
- a fourth screening layer disposed between the third screening layer and the second coil layer, the fourth screening layer comprising:
  - at least one fourth sheet of screening material;
  - the fourth screening layer being electrically connected to the second conductive coil portion via at least one fourth discrete connector and the fourth screening layer being kept from electrically contacting with the second conductive coil portion, except via the at least one fourth discrete connector, by a seventh insulating layer of insulating material; and
  - wherein an eighth insulating layer of insulating material is provided between the third and fourth screening layers.

11. An MRIS gradient coil assembly as claimed in claim 1 in which the coil assembly is arranged so that there is a maximum of three discrete first electrical connectors between the first coil portion and the first screening layer.

12. An MRIS gradient coil assembly as claimed in claim 1 in which the first insulating layer comprises B-stage material.

13. An MRI machine comprising an MRIS gradient coil assembly as claimed in claim 1.

14. An MRIS (magnetic resonance imaging and spectroscopy) gradient coil assembly comprising:
- a first coil layer comprising a first conductive coil portion of a first gradient coil;
- a second coil layer comprising a second conductive coil portion of a second gradient coil;
- a first screening layer, disposed between the first and second coil layers and comprising at least one first sheet of screening material, and
- a first insulating layer comprising insulating material provided between the first conductive coil portion and the first screening layer; and
- a second insulating layer comprising insulating material provided between the second conductive coil portion and the first screening layer, wherein
the MRIS gradient coil assembly comprises:
  - at least one discrete contact means electrically connecting the first conductive coil portion to the first screening layer and the first screening layer is kept from electrically contacting with the first conductive coil portion, except via the at least one first discrete contact means, by the first insulating layer; and
  - the first screening layer is also kept from electrically contacting with the second conductive coil portion by insulation comprising said second insulating layer;
  - whereby the only gradient coil to which the first discrete contact means is electrically connected is the first gradient coil.

15. An MRIS (magnetic resonance imaging and spectroscopy) gradient coil assembly comprising:
- a first coil layer comprising a first conductive coil portion of a first gradient coil;
- a second coil layer comprising a second conductive coil portion of a second gradient coil;
- a first screening layer, disposed between the first and second coil layers and comprising at least one first sheet of screening material;
- a first insulating layer comprising insulating material provided between the first conductive coil portion and the first screening layer; and
- a second insulating layer comprising insulating material between the second conductive coil portion and the first screening layer, wherein
the resistance per square of the at least one first sheet of screening material is greater than the resistance per square of the first coil layer and the second coil layer and lower than the resistance per square of the first insulating layer,
the MRIS gradient coil assembly comprises:
  - at least one first discrete connector electrically connecting the first conductive coil portion to the first screening layer; and
  - the first screening layer is kept from electrically contacting with the first conductive coil portion, except via the at least one first discrete connector, by the first insulating layer; and
  - the first screening layer is also kept from electrically contacting with the second conductive coil portion by insulation comprising said second insulating layer;
  - whereby the only gradient coil to which the first discrete connector is electrically connected is the first gradient coil, such that, in use, the first screening layer helps minimize any partial discharge in the region between the first screening layer and the first conductive coil portion by reducing an otherwise existing electric field in that region without preventing the gradient coil assembly from performing its overall function.

16. A partial discharge minimizing MRIS gradient coil assembly comprising:
   a first coil layer comprising a first conductive coil portion of a first gradient coil;
   a second coil layer comprising a second conductive coil portion of a second gradient coil;
   a first screening layer, disposed between the first and second coil layers and comprising at least one first sheet of screening material;
   a first insulating layer comprising insulating material provided between the first conductive coil portion and the first screening layer; and
   a second insulating layer comprising insulating material between the second conductive coil portion and the first screening layer, wherein
   the resistance per square of the sheet of the at least one first screening material is greater than the resistance per square of the first coil layer and the second coil layer and lower than the resistance per square of the first insulating layer,
   the MRIS gradient coil assembly also comprises at least one first discrete connector electrically connecting the first conductive coil portion to the first screening layer; and
      the first screening layer is kept from electrically contacting with the first conductive coil portion, except via the at least one first discrete connector, by the first insulating layer; and
      the first screening layer is also kept from electrically contacting with the second conductive coil portion by insulation comprising said second insulating layer;
      whereby the only gradient coil to which the first discrete connector is electrically connected is the first gradient coil such that, in use, the first screening layer has a potential which follows a potential of the first conductive coil portion and thus helps minimize any partial discharge in the region between the first screening layer and the first conductive coil portion by reducing an otherwise existing electric field in that region without preventing the gradient coil assembly from performing its overall function.

17. A partial discharge minimizing MRIS (magnetic resonance imaging and spectroscopy) gradient coil assembly comprising:
   a first coil layer comprising a first conductive coil portion of a first gradient coil;
   a second coil layer comprising a second conductive coil portion of a second gradient coil;
   a first screening layer, disposed between the first and second coil layers and comprising at least one first sheet of screening material;
   a first insulating layer comprising insulating material provided between the first conductive coil portion and the first screening layer; and
   a second insulating layer comprising insulating material between the second conductive coil portion and the first screening layer, wherein
   the resistance per square of the at least one first sheet of screening material is greater than the resistance per square of the first coil layer and the second coil layer and lower than the resistance per square of the first insulating layer,
   the MRIS gradient coil assembly also comprises at least one first discrete contact means electrically connecting the first conductive coil portion to the first screening layer, and
      the first screening layer is kept from electrically contacting with the first conductive coil portion, except via the at least one first discrete contact means, by the first insulating layer; and
      the first screening layer is also kept from electrically contacting with the second conductive coil portion by insulation comprising said second insulating layer;
   whereby the only gradient coil to which the first discrete contact means is electrically connected is the first gradient coil, such that, in use, the first screening layer has a potential which follows a potential of the first conductive coil portion and thus helps minimize any partial discharge in the region between the first screening layer and the first conductive coil portion by reducing an otherwise existing electric field in that region without preventing the gradient coil assembly from performing its overall function.

18. An MRIS gradient coil assembly as claimed in claim 1 in which the gradient coil assembly comprises each of an X-coil, a Y-coil and a Z-coil and one of the X-coil, Y-coil and Z-coil comprises the first conductive coil portion and another, different, one of the X-coil, Y-coil and Z-coil comprises the second conductive coil portion.

\* \* \* \* \*